(12) United States Patent
Stiepan et al.

(10) Patent No.: US 12,405,108 B2
(45) Date of Patent: Sep. 2, 2025

(54) PRODUCTION METHOD AND MEASUREMENT METHOD

(71) Applicant: Carl Zeiss SMT GmbH, Oberkochen (DE)

(72) Inventors: Hans Michael Stiepan, Aalen (DE); Thomas Monz, Schlierbach (DE); Julian Kaller, Koenigsbronn (DE); Ulrich Loering, Ulm (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 197 days.

(21) Appl. No.: 18/296,733

(22) Filed: Apr. 6, 2023

(65) Prior Publication Data

US 2023/0243644 A1    Aug. 3, 2023

Related U.S. Application Data

(63) Continuation of application No. PCT/EP2020/078193, filed on Oct. 8, 2020.

(51) Int. Cl.
*G01B 11/24* (2006.01)
*G01B 9/02* (2022.01)
(Continued)

(52) U.S. Cl.
CPC ...... *G01B 11/2441* (2013.01); *G01B 9/02039* (2013.01); *G01B 9/02076* (2013.01);
(Continued)

(58) Field of Classification Search
CPC ............ G01B 9/02039; G01B 9/02076; G01B 11/2441; G01M 11/005; G03F 7/70858; G03F 7/70883; G03F 7/70891
See application file for complete search history.

(56) References Cited

U.S. PATENT DOCUMENTS

| 7,591,561 B2 | 9/2009 | Phillips et al. |
| 8,342,701 B2 | 1/2013 | Kierey et al. |

(Continued)

FOREIGN PATENT DOCUMENTS

| DE | 102009039400 A1 | 3/2011 |
| DE | 102010034476 A1 | 2/2012 |

(Continued)

OTHER PUBLICATIONS

International Search Report, PCT/EP2020/078193, Jun. 17, 2021, 6 pages.

(Continued)

*Primary Examiner* — Michael A Lyons
(74) *Attorney, Agent, or Firm* — Edell, Shapiro & Finnan, LLC (57) ABSTRACT

A method for measuring a surface shape of an optical element, wherein the optical element has a main body with a substrate and a reflective surface, and wherein at least one cooling channel for receiving a coolant is formed in the substrate, comprising: a) recording a cooling channel pressure, b) recording a measurement environment pressure, c) determining a pressure difference based on the cooling channel pressure and the measurement environment pressure, d) comparing the pressure difference with a predetermined target pressure difference, e) monitoring for a deviation between the pressure difference and the target pressure difference, wherein, if a deviation greater than a predetermined limit value is detected, the cooling channel pressure is adapted in such a way that the deviation becomes less than or equal to the predetermined limit value, and f) measuring the surface shape if the deviation is less than or equal to the predetermined limit value.

13 Claims, 4 Drawing Sheets

(51) Int. Cl.
  *G01B 9/02055* (2022.01)
  *G01M 11/00* (2006.01)
  *G02B 5/08* (2006.01)
  *G02B 7/18* (2021.01)
  *G03F 7/00* (2006.01)

(52) U.S. Cl.
  CPC ......... *G01M 11/005* (2013.01); *G02B 5/0891* (2013.01); *G02B 7/1815* (2013.01); *G03F 7/70891* (2013.01); *G02B 2207/101* (2013.01)

(56) References Cited

U.S. PATENT DOCUMENTS

| | | |
|---|---|---|
| 10,337,850 B2 | 7/2019 | Hetzler et al. |
| 11,372,334 B2 | 6/2022 | Bauer et al. |
| 2013/0176614 A1 | 7/2013 | Anderl et al. |
| 2016/0008506 A1 | 1/2016 | Falanga |
| 2017/0299969 A1 | 10/2017 | Van De Rijdt et al. |
| 2018/0017372 A1 * | 1/2018 | Conley .............. G01B 9/02002 |
| 2023/0176492 A1 * | 6/2023 | Gruner ................ G03F 7/70891 |
| | | 355/30 |

FOREIGN PATENT DOCUMENTS

| | | |
|---|---|---|
| DE | 102015100918 A1 | 7/2016 |
| DE | 102015209490 A1 | 11/2016 |
| DE | 102018202687 A1 | 5/2018 |
| DE | 102018208783 A1 | 7/2018 |
| DE | 102017221388 A1 | 10/2018 |
| DE | 102019217530 A1 | 12/2019 |
| DE | 102019215828 A1 | 4/2021 |
| WO | 2009046955 A2 | 4/2009 |
| WO | 2012126830 A1 | 9/2012 |
| WO | WO-2013046934 A1 * | 4/2013 ......... G02B 21/0016 |

OTHER PUBLICATIONS

German Office Action with English translation, Application No. 10 2019 215 828.5, Mar. 8, 2021, 7 pages.

* cited by examiner

PRODUCTION METHOD AND MEASUREMENT METHOD

CROSS-REFERENCE TO RELATED APPLICATION

This is a Continuation of International Application PCT/EP2020/078193, which has an international filing date of Oct. 8, 2020, and the disclosure of which is incorporated in its entirety into the present Continuation by reference.

FIELD

The subject of this application relates to a method for measuring a surface shape of an optical element in a measurement environment, wherein the optical element has a main body with a substrate and a reflective surface, and wherein at least one cooling channel for receiving a coolant is formed in the substrate.

The subject of the application further relates to a measurement apparatus for measuring the surface shape of the optical element, to a method for producing the optical element, and to a projection exposure apparatus.

BACKGROUND

Microlithography is used to produce microstructured components, such as integrated circuits or LCDs (liquid crystal displays). The microlithography process is carried out, inter alia, in what is known as a projection exposure apparatus, which has an illumination device and a projection lens. The image of a mask (i.e., a reticle) is illuminated by the illumination device and, in this case, projected by the projection lens onto a substrate (for example a silicon wafer) that is coated with a light-sensitive layer (photoresist). The wafer is arranged in an image plane of the projection lens in order to transfer the mask structure onto the light-sensitive coating of the substrate.

In projection lenses designed for the EUV (extreme ultraviolet) range, i.e., at wavelengths of, for example, around 13 nm or around 7 nm, mirrors are used as optical elements for the imaging process due to a lack of availability of suitable light-transmissive refractive materials. Typical projection lenses designed for EUV, as are known from e.g., US 2016/0085061 A1, may have, for example, an image-side numerical aperture (NA) in the region of NA=0.55 and image an object field (for example ring-segment-shaped) into the image plane or wafer plane. The increase of the image-side numerical aperture (NA) is typically accompanied by an enlargement of the required mirror areas of the mirrors used in the projection exposure apparatus. This in turn means that it is not only manufacturing, but also examining or measuring the surface shape of the optical elements that represents a demanding challenge. The deviation of an actual shape from a predetermined target shape of the surface of an optical element that is to be determined here is referred to as "figure" in accordance with the usual terminology. Usually, interferometric measurement methods are used for high-precision figure measurement or measurement of the surface shape of the optical element.

It is also known that during operation of an optical system, EUV operation of the optical system for example, the optical element or elements of the projection exposure apparatus heats up as a result of absorption of the used light, in particular EUV light. The heating up of the optical element results in the problem that the optical element is thermally deformed, for example expands, and therefore an optical performance of the system in which the optical element is used no longer corresponds to a predetermined specifications.

To prevent the optical element from heating up, cooling concepts were developed in order to dissipate the heat generated in the optical element during operation. Known cooling concepts include forming at least one cooling channel for receiving a coolant in the otherwise solid main body or substrate of the optical element. Optical elements that have at least one such cooling channel are known from WO 2012/126830 A1, U.S. Pat. No. 7,591,561 B2, DE 10 2018 208 783 A1, DE 10 2010 034 476 A1, WO 2009/046955 A2, DE 10 2017 221 388 A1, and DE 10 2018 202 687 A1.

A challenge with optical elements that have at least one such cooling channel is the high-precision interferometric measurement of said optical elements.

There is thus a problem in that, typically when the optical element is used under typical EUV conditions, in particular when used under vacuum conditions, a pressure difference resulting from an ambient pressure and a cooling channel pressure arises, which pressure difference differs from a pressure difference that arises during a measurement of the optical element under measurement conditions or under measurement conditions that deviate from EUV conditions. These different pressure differences then lead to an undesired deformation in particular of the surface of the optical element in the case of a transition from EUV conditions to measurement conditions that deviate from EUV conditions, or vice versa. A surface shape measured under such measurement conditions thus differs from the surface shape that forms during EUV operation. An undesired effect of the deformation is that the optical element, in particular in EUV operation of the optical system, no longer meets or can no longer meet predetermined specifications. For example, a wavefront can be influenced in an undesired manner by a deformation, or stray light that influences an imaging quality of the projection lens in an undesired manner is generated.

A further problem is that the material of the substrate and in particular the cooling channel, which is typically filled with air, have different refractive indices. When measuring the surface shape with measurement light, the different refractive indices result in undesired back-reflection of the measurement light reflected in particular at an interface between the substrate and the cooling channel.

Against the above background, it is an object of the disclosed techniques to provide a method and a measurement apparatus with which the aforementioned problems are solved or accommodated, in particular with which the surface shape of an optical element having at least one cooling channel can be measured reliably and with high precision. Another object is to provide a production method for an optical element that can be measured reliably and with high precision, and to provide such an optical element.

These objects are achieved according to the features of the independent patent claims.

SUMMARY

According to the disclosed techniques, a method for measuring the surface shape of the optical element is carried out with the following steps: a) recording a cooling channel pressure; b) recording a measurement environment pressure; c) determining an actual pressure difference based on the cooling channel pressure and the measurement environment pressure; d) comparing the actual pressure difference with a predetermined target pressure difference; e) monitoring for a deviation between the actual pressure difference and the target pressure difference, wherein if a deviation greater than a predetermined limit value is detected, the cooling channel pressure is adapted in such a way that the deviation becomes less than or equal to the predetermined limit value; f) measuring the surface shape if the deviation is less than or equal to the predetermined limit value. The method according to the disclosed techniques may have the advantage that the actual pressure difference is adaptable or adjustable to the target pressure difference in a particularly simple manner, such as by adapting only one parameter, i.e., the cooling channel pressure. A target surface shape that forms under an arbitrarily predetermined target pressure difference can thus be produced particularly easily by a corresponding adaptation of the actual pressure difference and can then be measured. In the present disclosure, "measurement environment" means an environment in which there is a preferably predetermined measurement environment pressure and in which the optical element is measured and/or operated.

According to a particular embodiment, the cooling channel pressure is adapted in such a way that the deviation is less than 10 mbar, in particular less than 1 mbar, and preferably less than 0.5 mbar. The advantage here is that the actual pressure difference is adapted or adjusted particularly precisely to the target pressure difference. The measured surface shape or the surface shape that forms under the actual pressure difference thus corresponds particularly precisely to the surface shape that forms under the target pressure difference. Preferably, the cooling channel pressure is adapted in such a way that the deviation is equal to zero.

According to another embodiment, a gaseous or liquid coolant is fed into the cooling channel, wherein a pressure on the coolant is increased or decreased in order to adapt the cooling channel pressure. The advantage here is that the cooling channel pressure is adapted or adaptable in a particularly simple manner by increasing or decreasing the pressure on the coolant itself.

According to still another embodiment, the pressure on the coolant is increased or decreased hydraulically or pneumatically. This has the advantage that the cooling channel pressure is adapted particularly easily. A controllable hydraulic pump or pneumatic pump is preferably used to hydraulically or pneumatically increase or decrease the pressure on the coolant. Alternatively, the adaptation of the pressure on the coolant is made electronically by a controllable electric pump. An increase or decrease in the pressure occurs, in particular, in dependence on an increase or decrease in a delivery rate of the corresponding pump, for example by adapting a speed or delivery speed.

According to another example embodiment, the coolant flows through the cooling channel at a predetermined flow speed. The predetermined flow speed is preferably at least substantially identical to the flow speed at which the coolant flows through the cooling channel, in particular the flow speed of the coolant during operation of an EUV lithography apparatus under EUV conditions. This ensures that measurement relating to the flow speed is performed under EUV conditions. In addition or as an alternative, the flow speed is preferably selected in dependence on a geometry or a cross section of the cooling channel. The flow speed is preferably selected such that a laminar flow forms in the cooling channel. Critical pressure losses as a result of turbulent flows and resulting vibrations or oscillations of the optical element are thus avoided. In addition, a dynamic viscosity of the coolant is preferably selected or set such that it is at least substantially the same as that of water, in particular at least 0.89 mPa's and at most 1.52 mPa·s.

According to yet another embodiment, the target pressure difference is determined in dependence on a predetermined target measurement environment pressure and a predetermined target cooling channel pressure, wherein the target measurement environment pressure is at least 0.01 mbar and at most 0.20 mbar and the target cooling channel pressure is at least 200 mbar and at most 10 000 mbar. The advantage here is that a multiplicity of target pressure differences which are or can be present when the optical element is used or in operation, in particular under EUV conditions, are determined or set on the basis of the predetermined or selectable target measurement environment pressures and target cooling channel pressures. The surface shape to be measured or the surface shape that forms under the actual pressure difference thus corresponds to a surface shape that forms in particular under EUV conditions. Alternatively, the target measurement environment pressure is preferably at least 0.01 mbar and at most 1000 mbar. Preferably, the target measurement environment pressure is 1000 mbar and the target cooling channel pressure is at least 1200 mbar and at most 10 000 mbar. In this case, the measured surface shape or the surface shape that forms under the actual pressure difference corresponds to a surface shape that forms in particular under atmospheric pressure conditions.

According to other embodiments of the disclosed techniques, the predetermined target measurement environment pressure is at least 0.03 mbar and at most 0.1 mbar and the target cooling channel pressure is at least 500 mbar and at most 1000 mbar. The advantage here is that the target pressure difference is determined on the basis of a particularly narrowly selected target measurement environment pressure interval and target cooling channel pressure interval. In particular, a target pressure difference selected from this target measurement environment pressure interval and target cooling channel pressure interval corresponds to a pressure difference as is typically present when the optical element is used or in operation under EUV conditions.

According to another embodiment, the predetermined target measurement environment pressure is 0.05 mbar and the predetermined target cooling channel pressure is 500 mbar. The advantage is that a firmly determined target pressure difference is predetermined on the basis of this target measurement environment pressure and this target cooling channel pressure. In particular, this firmly determined target pressure difference corresponds to a pressure difference as is typically present when the optical element is used or in operation under EUV conditions. The measured surface shape or the surface shape that forms under the actual pressure difference thus particularly precisely corresponds to the surface shape that forms under EUV conditions.

The disclosed techniques also relate to a measurement apparatus for measuring a surface shape of an optical element, wherein the optical element has a main body with a substrate and a reflective surface, and wherein at least one cooling channel for receiving a coolant is formed in the substrate. The measurement apparatus includes: i) a measurement light source; ii) an interferometer, with which a measurement of at least a partial surface of a surface of the optical element is able to be carried out by interferometric superposition of a test wave, which is obtained from measurement light produced by the measurement light source and is directed onto the optical element, and a reference wave; iii) at least one controllable coolant reservoir for storing coolant, and iv) a control device which is designed to carry out the method as claimed as claimed herein when used as intended. The advantages already mentioned are afforded thereby. Further advantages and preferred features are evident from the description above and from the claims.

According to another embodiment of the measurement apparatus, the coolant has a refractive index that is at least substantially equal to a refractive index of the substrate of the optical element to be examined. This results in the advantage of a particularly precise measurement, or measurability, in particular minimized in terms of disruptive reflections, of the surface shape of the optical element. Undesired back-reflections of the measurement light reflected in particular at an interface between the substrate and the cooling channel due to a difference in refractive index are prevented by the appropriate selection of the refractive index of the coolant. In particular, interference of the measurement light reflected at the reflective surface with the undesired back-reflections is thus avoided. Additionally, the cooling channels, in particular the walls of the cooling channels, optionally have a predetermined roughness to ensure a diffuse scattering effect. The diffuse scattering reduces disruptive reflections. Preferably, a dynamic viscosity of the coolant is at least substantially the same as that of water, in particular at least 0.89 mPa's and at most 1.52 mPa·s.

According to yet another embodiment, the coolant is a solution of an inorganic or organic substance in water. The advantage here is that the refractive index is variably settable, in particular in dependence on a predetermined concentration of the substance. The substance is, for example, sugar or potassium iodide.

According still another embodiment, the substance forms a homogeneous phase when mixed with water. In the present disclosure "homogeneous phase" means that the distribution of the substance in the water is substantially the same at every point. This ensures, in particular, that the refractive index of the coolant is substantially the same at every point in the cooling channel into which coolant is fed.

The disclosed techniques furthermore relate to a method for producing an optical element, wherein the optical element has a main body with a substrate and a reflective surface, and wherein at least one cooling channel for receiving a coolant is formed in the substrate. The cooling channel is produced by a cutting manufacturing process, in particular drilling, and/or by an etching process. The substrate and the reflective surface are in particular formed in one piece.

According to the disclosed techniques, a mirror body has the reflective surface, wherein the substrate and the mirror body having the reflective surface are connected to one another by a joining process, in particular bonding. In this case, the cooling channel is produced in the substrate by an etching process, by grinding, and/or by milling. According to this, the substrate and the reflective surface are not formed in one piece. The mirror body and the substrate are preferably made of the same material. Alternatively, the cooling channel is produced in the mirror body having the reflective surface by grinding, milling, and/or etching. In this case, the substrate is preferably polished at least in part, so that the substrate and the mirror body having the reflective surface can be connected or are connectable to one another, particularly advantageously by the joining process.

According to the disclosed techniques, the joining process is performed in such a way that the reflective surface and a boundary layer that forms between the reflective surface and the substrate as a result of the joining process are at least in part not aligned congruently with one another. In the present disclosure, "not congruent" means that a first tangential plane at a predetermined point on the reflective surface and a second tangential plane at a predetermined point on the boundary layer are not aligned parallel to one another. In other words, a normal vector of the first tangential plane and a normal vector of the second tangential plane have a deviation of greater than zero from one another. The predetermined point on the reflective surface and the predetermined point on the boundary layer are arranged along a straight line, wherein the straight line is aligned parallel to an optical axis of the optical element. The advantage here is that superposition of the measurement light reflected at the reflective surface and the measurement light reflected at the boundary layer effectively avoided. Thus, a measurement light beam that is incident on the boundary layer will have an angle of reflection which differs from an angle of reflection of a measurement light beam that is incident on the reflective surface. This is particularly advantageous if the boundary layer that forms has a refractive index that differs from the refractive index of the substrate or of the mirror body having the reflective surface. The reflective surface and the boundary layer can each be planar, that is to say without curvature, or have a curvature.

According to a embodiment, a layer which is designed to reflect light with a wavelength of at least 193 nm and at most 633 nm, in particular at least 532 nm and at most 633 nm, is applied, at least in part, onto the reflective surface. This has the advantage that the optical element is measurable with high precision by measurement light, i.e., light with a wavelength of at least 193 nm and at most 633 nm. In addition, the layer or measurement layer prevents the measurement light beam from reaching or being able to reach a boundary layer that forms between the reflective surface and the substrate as a result of the joining process. The layer preferably has at least one silicon layer and/or at least one chromium layer. Advantageously, the reflective surface can be processed by ion beam figuring.

According to another embodiment, the substrate comprises a material that is formed in such a way that it absorbs light of a predetermined wavelength, in particular a wavelength of at least 193 nm and at most 633 nm, in particular at least 532 nm and at most 633 nm. The material of the substrate is preferably doped with an absorption-enhancing material. Preferably, the substrate and the reflective surface are formed in one piece. If the substrate and a mirror body having the reflective surface are connected to one another by bonding, the mirror body preferably comprises the material that is designed to absorb the light of a predetermined wavelength.

Furthermore, the disclosed techniques relate to a projection exposure apparatus for semiconductor lithography, having: i) an illumination device; ii) a projection lens, and iii) at least one optical element, which has a main body with a substrate and a reflective surface, wherein at least one cooling channel for receiving a coolant is formed in the substrate. The projection exposure apparatus is characterized in that the optical element is produced by a method as claimed herein.

BRIEF DESCRIPTION OF THE DRAWINGS

The disclosed techniques will be explained in greater detail below with reference to the drawings. In this respect.

DETAILED DESCRIPTION

Figure 1:
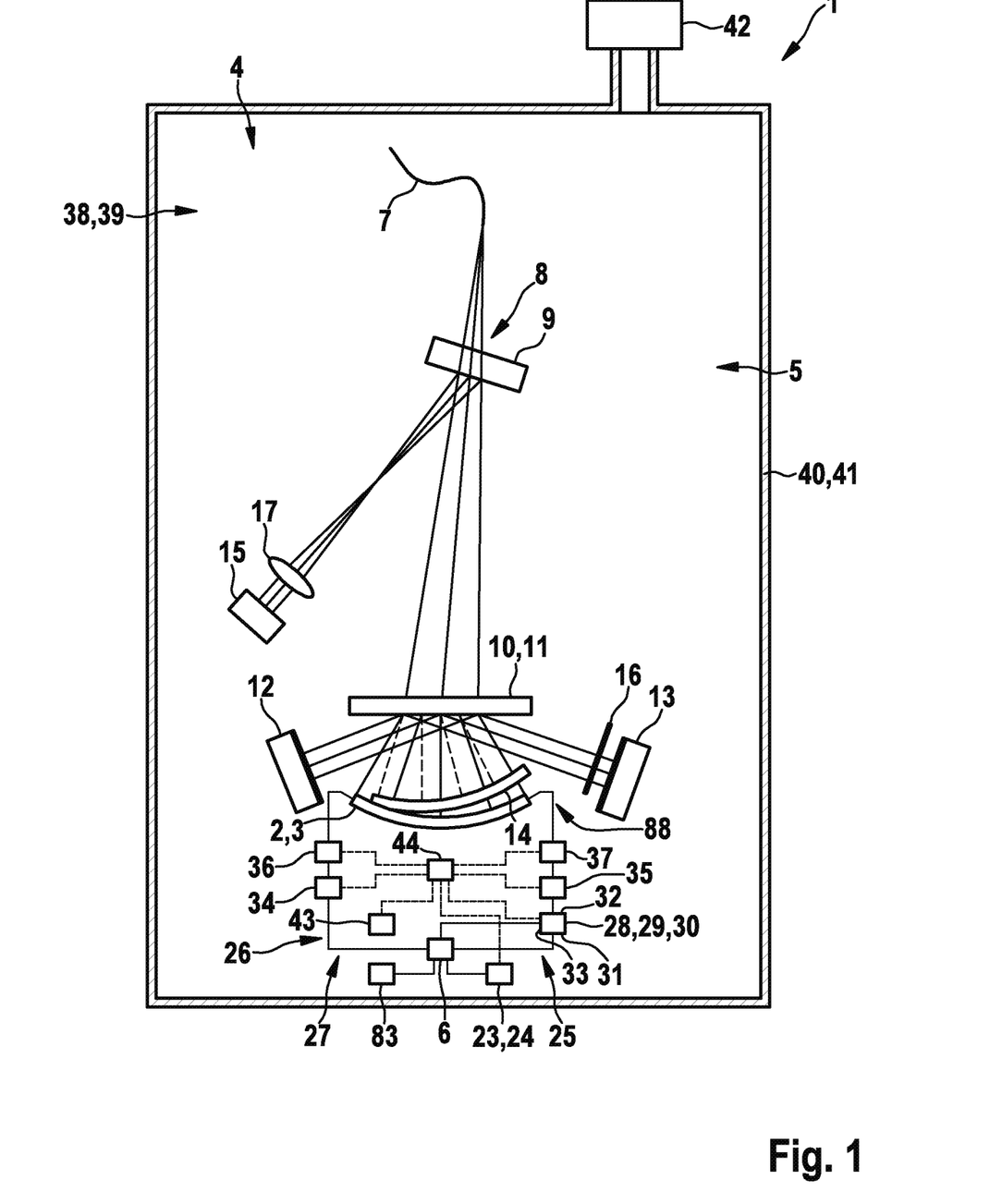
FIG. 1 shows a schematic illustration of a measurement apparatus according to an exemplary embodiment.

FIG. 1 shows a schematic illustration of a particular interferometric measurement apparatus 1 of a microlithographic projection exposure apparatus for measuring a surface shape of an optical element 2, which in the example of FIG. 1 is | a mirror 3. The measurement apparatus 1 has at least one measurement light source 4 (not shown here), an interferometer 5, and a coolant reservoir 6.

The measurement light source 4 generates measurement light or measurement light radiation of a predetermined wavelength or a plurality of predetermined wavelengths, for example 193 nm, 532 nm and/or 633 nm. The measurement light radiation enters the interferometer 5 from an exit surface of an optical waveguide 7 in the form of an input wave 8 having a spherical wavefront.

The interferometer 5 comprises, without being limited to this, a beam splitter 9, a diffractive optical element 10 in the form of a particular complex coded computer-generated hologram (CGH) 11, three reflective elements 12, 13, 14, the optical element 2 to be measured, and an interferometer camera 15. The interferometer 5 optionally comprises fewer or more components than those described. Thus, the can comprise fewer than three or more than three reflective elements 12, 13, 14. The interferometer 5 may also include the measurement light source 4 as well.

The measurement light radiation or input wave 8 passes through the beam splitter 9 and is then incident on the CGH 11. In transmission, the CGH 11 generates a total of four output waves from the input wave 8 according to its complex encoding, of which one output wave is incident as a test wave on a surface of the optical element 2 to be measured with a wavefront adapted to a target shape of the surface of the optical element 2.

According to the present exemplary embodiment, the transmission of input wave 8 through CGH 11 generates three further output waves, each of which is incident on one of the reflective elements 12, 13, 14. Of these reflective elements 12, 13, 14, the elements 12 and 13 are each designed as a plane mirror and the reflective element 14 as a spherical mirror in the exemplary embodiment. An optionally provided shutter is denoted by the reference sign 16. The CGH 11 is also used for superimposing the test wave reflected by the optical element 2 to be measured and the reference waves, which are reflected by the reflective elements 12, 13, 14 and are incident again, as convergent beams, on the beam splitter 9. Beam splitter 9 reflects the test wave and the reference waves in the direction of the interferometer camera 15, wherein they pass through an eyepiece 17. The interferometer camera 15 captures an interferogram, which is generated by the interfering waves and from which an actual shape or the surface shape of the optical element 2 is determined by an evaluation device (not shown).

In the present case, the optical element 2 has a main body 18 with a substrate 19 and a reflective surface 20, wherein at least one cooling channel 21 (not shown here) for receiving a gaseous or liquid coolant 22 is formed in the substrate 19. The material of the substrate 19 is, for example, a glass material such as quartz glass or a glass ceramic material such as Zerodur®, manufactured by Glaswerke Schott, or ULE® (ultra-low expansion) glass, manufactured by Corning. At a wavelength of 546.1 nm, quartz glass has a refractive index of 1.45, ULE® glass has a refractive index of 1.4828, and Zerodur® has a refractive index of 1.5447.

The measurement apparatus 1 has the coolant reservoir 6 for storing coolant 22. Preferably, the measurement apparatus 1 also has a controllable delivery device 23, in particular a pump 24, connected to the coolant reservoir 6, for delivering the coolant 22 from the coolant reservoir 6 and thus for feeding the coolant 22 into the cooling channel 21 and/or for pressurizing the coolant 22. The delivery device 23 is preferably a hydraulic pump, pneumatic pump, or electric pump.

In the present case, the coolant 22 is supplied to the optical element 2, in particular to the cooling channel 21, through a supply line 25 connected to the coolant reservoir 6 and removed from the optical element 2, in particular from the cooling channel 21, through a discharge line 26 connected to the coolant reservoir. The coolant 22 preferably returns to the coolant reservoir 6 through the discharge line 26 in order to be able to be delivered again from there. In the present case, the supply line 25 and the discharge line 26 form a delivery line 27. Preferably, the supply line 25 and the discharge line 26 are each connectable to the optical element 2, in particular designed for a detachable connection. The supply line 25 and/or the discharge line 26 can each be designed as a hose with a predetermined diameter. The supply line 25 and the discharge line 26 may be designed in such a way that oscillations or vibrations that can occur during operation of the measurement apparatus 1, in particular while coolant 22 is being delivered from the coolant reservoir 6, are damped or suppressed. The optical element 2 is thus not influenced by oscillations and vibrations during the delivery of coolant 22 from the coolant reservoir 6; in particular, the optical element 2 itself is not excited to oscillate and vibrate.

To damp vibrations, the supply line 25 is arranged, for example such that it sags or is not taut, between the optical element 2 and a sensor 37, in particular a flow sensor, or between the optical element 2 and the pressure recording device 35, or between the optical element 2 and the outlet side 32 of the pressure regulation device 28. If the supply line 25 is intended to be arranged so that it sags, for example, between the optical element 2 and the sensor 37, a length of the supply line 25, in particular a length of a supply line section 88 between the optical element 2 and the sensor 37, is selected to be greater than the distance between the optical element 2 and the sensor 37 in order to ensure the sagging. For oscillation damping, the discharge line 26 is arranged, for example so that it sags or is not taut, between the optical element 2 and the pressure recording device 36 or between the optical element 2 and the pressure regulation device 34.

The coolant 22 is preferably delivered from the coolant reservoir 6 in such a way that a pressure or cooling channel pressure of at least 200 mbar and at most 10 000 mbar forms in the at least one cooling channel 21. Pressure on the coolant 22 is increased or decreased in order to increase or decrease the cooling channel pressure or to pressurize the coolant 22. The pressure is preferably adapted by adapting, i.e., by increasing or decreasing, the delivery rate of the delivery device 23. For example, the delivery speed of pump 24 may be adapted to adapt the pressure. A predetermined flow speed or a volumetric flow rate with which the coolant 22 flows through the delivery line 27, in particular the cooling channel 21, is preferably likewise set by adapting the delivery rate of the delivery device 23.

In order to ensure the settability or setting of a predetermined or defined cooling channel pressure, which forms in the cooling channel 21, the supply line 25 preferably has at least one controllable pressure regulation device 28, in particular a two-way pressure regulating valve 29 or three-way pressure regulating valve 30. The pressure regulation device 28 has an inlet side 31 assigned to the coolant reservoir 6 and an outlet side 32 assigned to the optical element 2 or cooling channel 21. The two-way pressure regulating valve 29 and the three-way pressure regulating valve 30 are preferably each designed to convert an inlet-side pressure into a predetermined outlet-side pressure. In particular, the three-way pressure regulating valve 30 is preferably designed to open if a predetermined pressure on the inlet side 31 is exceeded, with the result that the pressure on the outlet side 32 is lower than the pressure on the inlet side 31. The three-way pressure regulating valve 30 preferably has an overflow outlet 33, which is connected to the coolant reservoir 6 such that, if the predetermined pressure on the inlet side 31 is exceeded, the overflow outlet 33 opens and coolant 22 can be discharged from the pressure regulating valve 28 and returned to the coolant reservoir 6. Optionally, the discharge line 26 has a further controllable pressure regulation device 34. Optionally, the pressure regulation device 28 is connectable or connected directly to the optical element 2 or the optical element 2 has the pressure regulation device 28.

To record the cooling channel pressure, in particular to record the pressure of the coolant 22 in the supply line 25, a pressure recording device 35, for example a pressure sensor or manometer, is preferably arranged between the pressure regulation device 28 and the optical element 2, in particular the cooling channel 21 of the optical element 2 or an inlet side of the cooling channel 21 of the optical element 2. Optionally, a further pressure recording device 36 is provided between the optical element 2, in particular the cooling channel 21 or an outlet side of the cooling channel 21, and the further pressure regulation device 34.

A sensor 37, in particular a flow sensor, is preferably arranged between the pressure regulation device 28 and the optical element 2, in particular the cooling channel 21 of the optical element 2 or the inlet side of the cooling channel 21 of the optical element 2, for recording a flow speed or a volumetric flow rate of the coolant 22 in the cooling channel 21. Alternatively, the flow speed is ascertained in dependence on the pressures recorded by the pressure recording device 35 and the further pressure recording device 36.

For temperature control, in particular for cooling or heating the coolant 22, the measurement apparatus 1 optionally has a temperature control device 83 connected to the coolant reservoir 6. Since a dynamic viscosity of the coolant 22 depends on the temperature and pressure, the temperature of the coolant 22 is preferably controlled in such a way that the dynamic viscosity of the coolant 22 corresponds to a predetermined dynamic viscosity, in particular that of water, preferably at least 0.891 mPa's and at most 1.52 mPa's. Optionally, the temperature of the coolant 22 is controlled in such a way that a coolant temperature is at least substantially equal to a predetermined temperature, for example an operating temperature of an EUV lithography apparatus. Additionally or alternatively, the pressure on the coolant 22 is adapted to change the dynamic viscosity. In order to record a temperature of the coolant 22, the measurement apparatus 1 or the temperature control device 83 preferably has a temperature sensor.

According to the present exemplary embodiment, the measurement apparatus 1 is arranged in a housing 40 enclosing an interior space 38 or a measurement environment 39, in particular a vacuum chamber 41. At least one controllable vacuum generating unit 42, for example a vacuum pump, is assigned to the housing 40 for generating a vacuum in the interior space 38 or the measurement environment 39. The vacuum generating unit 42 is preferably designed to generate in the housing 40 a vacuum with a total pressure or measurement environment pressure of at least 0.01 mbar, in particular less than 0.01 mbar, and at most 0.1 mbar. This ensures that the surface shape of the optical element 2 is or can be measured at a measurement environment pressure which corresponds to a pressure that is present when the optical element 2 is used, in particular in combination with an EUV lithography apparatus, in an EUV operating vacuum. Alternatively, the surface shape is measured at the air pressure that prevails at the location of the measurement, in particular at an atmospheric pressure of 1 bar, or at any predetermined measurement environment pressure. The measurement apparatus 1 preferably has a pressure sensor 43 for recording the measurement environment pressure.

Alternatively, the measurement arrangement 1 is not arranged in the housing 40 or the vacuum chamber 41. In that case, the surface shape is measured at air pressure, in particular atmospheric pressure. The measurement environment can then be the interior space 38 or another measurement environment, in particular a measurement environment that is not closed by a housing.

Furthermore, the measurement apparatus 1 has a control device 44. The control device 44 is specially configured to control, in particular, the delivery device 23 and/or at least one of the pressure regulating valves 29, 30, in particular the pressure regulating valve 29. In the present case, without being limited hereto, the control device 44 is connected, in terms of signal transmission, by a wire-based data line or wireless data line, to the delivery device 23, to at least one of the pressure regulation devices 28, 34, to the pressure sensor 43, to at least one of the pressure recording devices 35, 36, to the flow sensor 37, and/or preferably to the measurement light source 4.

The coolant 22 preferably has a refractive index that is at least substantially equal to a refractive index of the substrate 19 or the substrate material of the optical element 2 to be measured. This ensures that the optical element 2 can be measured in a particularly advantageous manner, since undesired back-reflections at an interface between the substrate 19 and the cooling channel 21 are minimized. The coolant 22 preferably has an inorganic or organic substance, which is preferably miscible with water, and in particular forms a homogeneous phase when mixed with water. Preferably, the coolant 22 has a very low or a very high vapor pressure. This ensures that the coolant 22 remains liquid at low pressures or under vacuum pressure conditions. If the coolant 22 is carried over into a vacuum system, the coolant 22 can therefore be removed easily or with little effort from the cooling channel 21. The substance or the coolant 22 is preferably not a hazardous substance, i.e., it can be handled safely and be disposed of in an environmentally friendly manner.

The substance is, for example, sugar, in particular a 79% by weight solution of sucrose with water. This sucrose solution is preferably prepared by dissolving sugar in water at at least 70° C. and then cooling the solution. This results in a refractive index of 1.483 at a temperature of 20° C., wherein this refractive index corresponds at least substantially to the refractive index of ULE® glass. Alternatively, the substance is potassium iodide, wherein a refractive index of at least 1.33 (potassium iodide proportion of zero percent) and at most 1.502 (saturated potassium iodide solution) is settable depending on a predetermined proportion of potassium iodide in water. Alternatively, the coolant 22 is glycerol (refractive index: 1.474).

Alternatively, the coolant 22 is a sodium polytungstate solution, wherein a refractive index of at least 1.33 (sodium polytungstate proportion of zero percent) and at most 1.55 (saturated sodium polytungstate solution) is settable depending on a predetermined proportion of the substance sodium polytungstate in water. Alternatively, the following oils or organic substances are provided as coolant 22: tetrahydronaphthalene (refractive index: 1.541), methyl salicylate (refractive index: 1.535), or eugenol (refractive index: 1.541). These refractive indices correspond at least substantially to the refractive index of Zerodur® in particular.

Since the refractive index is a function of wavelength and temperature, a temperature of the measurement environment 39 and the wavelength of the measurement light radiation are preferably taken into account when selecting the coolant 22 or the refractive index of the coolant 22. If the measurement light source 4 is designed to emit measurement light radiation of different wavelengths, for example 532 nm and 633 nm, a first and a second refractive index of the substrate 19 are determined for a respective wavelength and the mean value of the refractive index is formed therefrom. According to the mean value formed, the coolant 22 is then selected in such a way that its refractive index is at least substantially the same as the mean value. Alternatively, the refractive index is calculated in dependence on an Abbé number of the material of the substrate 19 and the temperature coefficient of the refractive index, which is defined as dn/dT, wherein n is the refractive index of the substrate 19 and T is the temperature of the measurement environment. Alternatively, the refractive index of the substrate 19 is measured, for example by a refractometer, spectrometer, interferometer, or immersion and ellipsometric methods. The abovementioned refractive indices of the respective coolants 22 and substrates 19 or substrate materials are therefore to be understood as examples. Actual refractive indices can deviate from the stated refractive indices in particular in dependence on the wavelength of the measurement light radiation and the temperature of the measurement environment 39.

Alternatively, the coolant is a gaseous coolant, for example nitrogen or dry air, i.e., air with a predetermined relative humidity, for example less than 40%. Alternatively, the liquid coolant is water, for example, in particular ultrapure water.

Figure 2:
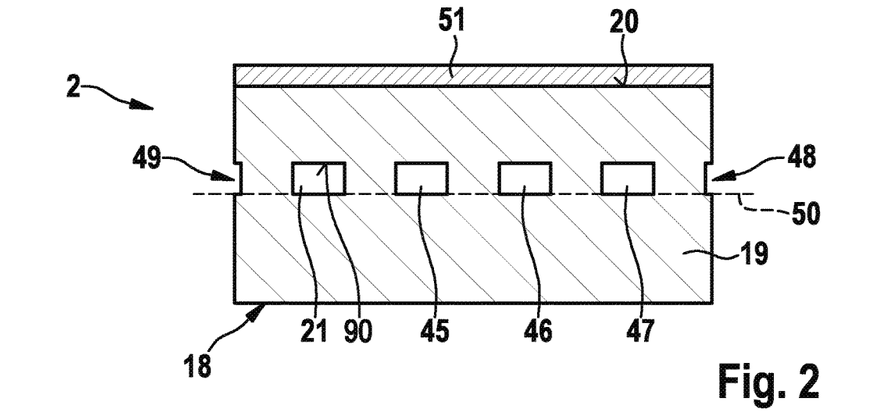
FIG. 2 shows a schematic illustration of an optical element according to a first exemplary embodiment.

FIG. 2 shows a simplified cross-sectional illustration of the optical element 2 according to a first embodiment. The optical element 2 has the main body 18 with the substrate 19 and the reflective surface 20. At least one cooling channel 21, in the present case a plurality of cooling channels 21, 45, 46, 47 that are adjacent to one another, for receiving the coolant 22 is/are formed in the substrate 19. The spacing between two mutually adjacent cooling channels 21, 45, 46, 47 is preferably at least 1 mm and at most 12 mm. The mutually adjacent cooling channels 21, 45, 46, 47 are presently arranged in one plane or cooling channel plane 50. The substrate 19 optionally has at least one further cooling channel plane, which is arranged in particular below the cooling channel plane 50.

Preferably, at least 20 and at most 200 cooling channels 21 are formed in the substrate 19. A respective cooling channel 21 preferably has a rectangular or circular cross section, wherein a diameter of the respective cooling channel 21 is at least 0.5 mm and at most 5 mm. The cooling channels 21, 45, 46, 47 are formed, for example, in a meandering shape or parallel to one another. The spacing between the cooling channel 21, in particular an upper cooling channel wall 90 of a respective cooling channel 21, 45, 46, 47, and the reflective surface 20 is preferably at least 2 mm and at most 30 mm.

Preferably, the optical element 2, in particular the substrate 19, has a first and a second connection opening 48, 49, wherein the first and the second connection opening 48, 49 are formed in such a way that the first connection opening 48 is connectable to the supply line 25 and the second connection opening 49 is connectable to the discharge line 26, or vice versa. Alternatively or additionally, at least one of the connection openings 48, 49 is designed for direct connection, that is to say without the interposition of a supply line 25, to the pressure regulation device 28. In particular, the cooling channels 21, 45, 46, 47, which are designed or aligned parallel to one another, preferably respectively open into the first connection opening 48 and into the second connection opening 49. The spacing between the connection openings 48, 49 is preferably at least 50 mm and at most 1000 mm.

A single-layer or multi-layer reflection layer 51, which is designed in particular for reflecting measurement light radiation with a wavelength of in particular 193 nm, 532 nm and/or 633 nm, is preferably applied onto the reflective surface 20. This ensures reliable reflection of the measurement light radiation and thus a reliable measurement or measurability of the surface shape of the optical element 2. The single-layer or multi-layer reflection layer 51 preferably has sputtered chromium and/or silicon, in particular at least one chromium layer and/or one silicon layer. Optionally or additionally, the material of the substrate 19 is formed, in particular doped, in such a way that it absorbs the measurement light radiation.

Optionally, no reflective layer 51 is applied to the reflective surface 20.

The cooling channels 21, 45, 46, 47 are or have been produced preferably by a cutting manufacturing method, for example by drilling. In the present case, the substrate 19 and the reflective surface 20 are formed in one piece.

The optical element 2 optionally has the pressure regulation device 28. The pressure regulation device 28 is preferably arranged directly, for example with the interposition of a connecting element such as the supply line 25, or directly at one of the connection openings 48, 49.

Figure 3:
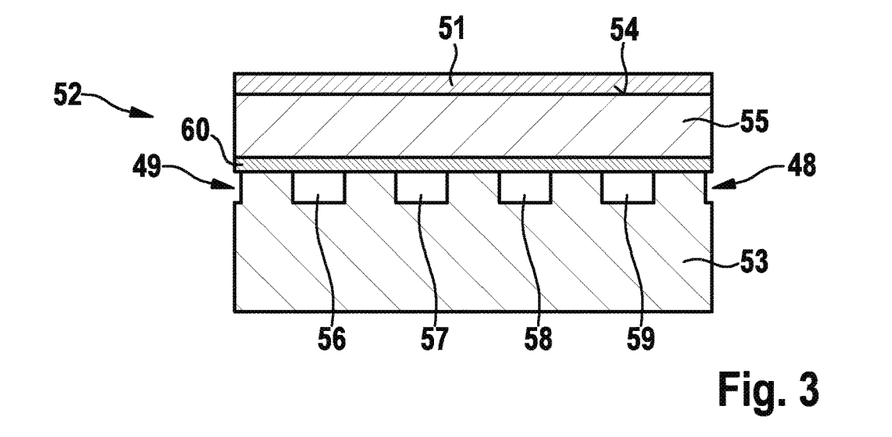
FIG. 3 shows a schematic illustration of an optical element according to a second exemplary embodiment.

FIG. 3 shows the optical element 52 according to a second embodiment in a simplified cross-sectional illustration. The optical element 52 substantially corresponds to the optical element from FIG. 2. However, the difference is that a mirror body 55 has the reflective surface 20, 54 and that the substrate 53 and the reflective surface 20, 54, or the substrate 53 and the mirror body 55 having the reflective surface 20, 54, are not formed in one piece.

The structures for forming the cooling channels 56, 57, 58, 59 are or have been preferably introduced or produced in particular in the substrate 53 by milling, grinding and/or etching. After the milling and/or grinding, the substrate 53 or the substrate material is preferably etched. The structures of the cooling channels 56, 57, 58, 59 are optionally produced by a laser-based method, for example laser ablation or selective laser etching. Alternatively, the cooling channel 56, 57, 58, 59 is formed in the mirror body 55 having the reflective surface 20, 54 in particular by grinding, milling and/or etching. In this case, the substrate 53 is preferably polished at least in part, so that the substrate 53 and the mirror body 55 having the reflective surface 20, 54 can be connected or are connectable to one another particularly advantageously by the joining process.

In the present case, the reflective surface 20, 54, or the mirror body 55 having the reflective surface 20, 54, and the substrate 53 have been or are connected by a joining process, in particular bonding. As a result of the bonding, cooling channels 56, 57, 58, 59 that are closed in particular all around, i.e., on all sides, are formed. The substrate 53 and the reflective surface 20, 54, or the mirror body 55 having the reflective surface 20, 54, are preferably made of the same material, in particular of the material of the substrate 53.

A boundary layer 60 can form as a result of the bonding. Such a boundary layer 60 that forms is shown here. The boundary layer 60 typically has a refractive index that differs from the refractive index of the substrate material.

In order to avoid disruptive or unwanted reflections of the measurement light or of the measurement light radiation at the boundary layer 60, the optical element 52 preferably has the reflection layer 51. Optionally, the optical element 52 does not have a reflection layer. In that case, the substrate material and/or the mirror body 55 is preferably formed, in particular doped, in such a way that it absorbs the measurement light radiation in order to prevent measurement light radiation from penetrating into the substrate 53 and/or into the mirror body 55 and thereby in particular to the boundary layer 60. Alternatively, the material of the boundary layer 60 is doped in such a way that it absorbs light of a predetermined wavelength, in particular a wavelength of at least 193 nm and at most 633 nm, in particular at least 532 nm and at most 633 nm. Optionally, the cooling channels, in particular the walls of the cooling channels, have a predetermined roughness to ensure a diffuse scattering effect. The roughness is achieved in particular by a corresponding etching process.

Figure 4:
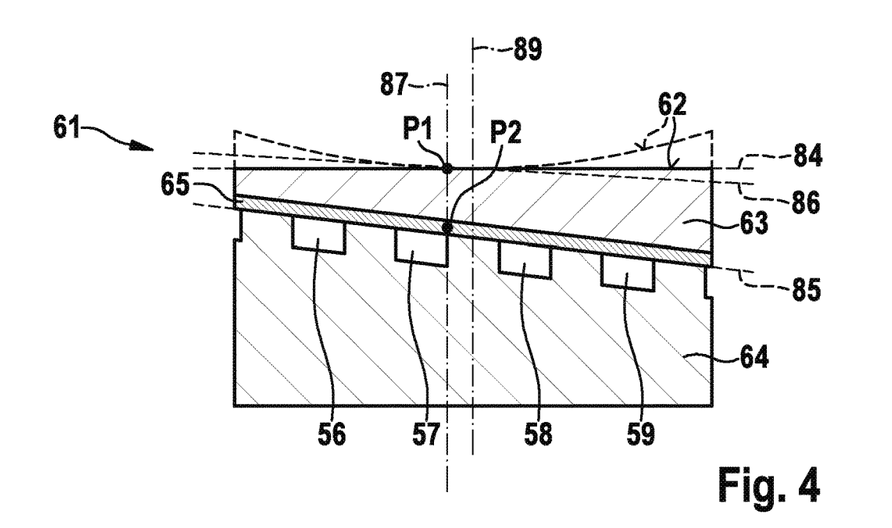
FIG. 4 shows a schematic illustration of an optical element according to a third exemplary embodiment.

FIG. 4 shows a simplified cross-sectional representation of a further optical element 61, in which the reflective surface 62, or the mirror body 63 having the reflective surface 62, and the substrate 64 are connected by a joining process, in particular bonding.

According to the present exemplary embodiment, the bonding takes place such that the reflective surface 62 and the boundary layer 65 that forms in the process are at least in part not aligned congruently with one another. "Not congruent" means that a first tangential plane 84 at a predetermined point, here the point P1, on the reflective surface 62 and a second tangential plane 85 at a predetermined point, here the point P2, on the boundary layer 65 are not aligned parallel to one another. In other words: a normal vector of the first tangential plane 84 and a normal vector of the second tangential plane 85 have a deviation of greater than zero from one another.

If, as is the case here, the reflective surface 62 and the boundary layer 65 that forms are each planar, i.e., without curvature, for example, then "not congruent" means that the reflective surface 62 or the first tangential plane 84 and the boundary layer 65 that forms or the second tangential plane 85 are not aligned parallel to one another.

If, for example, only the boundary layer 65 is planar and the reflective surface 62 is curved at least in part (or vice versa), as shown in dashed lines here, "not congruent" means that the boundary layer 65 or the second tangential plane 85 and the reflective surface 62, in particular a third tangential plane 86 that is present in connection with the curved reflective surface 62 at point P1, are not aligned parallel to one another.

If both the reflective surface 62 and the boundary layer 65 are curved at least in part, "not congruent" means that the tangential plane at a predetermined point P2 of the boundary layer and the tangential plane at a predetermined point P1 of the reflective surface are not aligned parallel to one another.

The predetermined point P1 and the predetermined point P2 are preferably arranged along a straight line 87, wherein the straight line 87 is aligned parallel to an optical axis 89 of the optical element 2, 52, 61.

A reflective layer is not provided according to this embodiment, but can optionally be provided.

The substrate 64 and/or the mirror body 63 optionally comprises a material that is formed in such a way that it absorbs light of a predetermined wavelength, in particular a wavelength of at least 193 nm and at most 633 nm, in particular at least 532 nm and at most 633 nm. Alternatively, the material of the boundary layer 65 is doped in such a way that it absorbs light of a predetermined wavelength, in particular a wavelength of at least 193 nm and at most 633 nm, in particular at least 532 nm and at most 633 nm.

Figure 5:
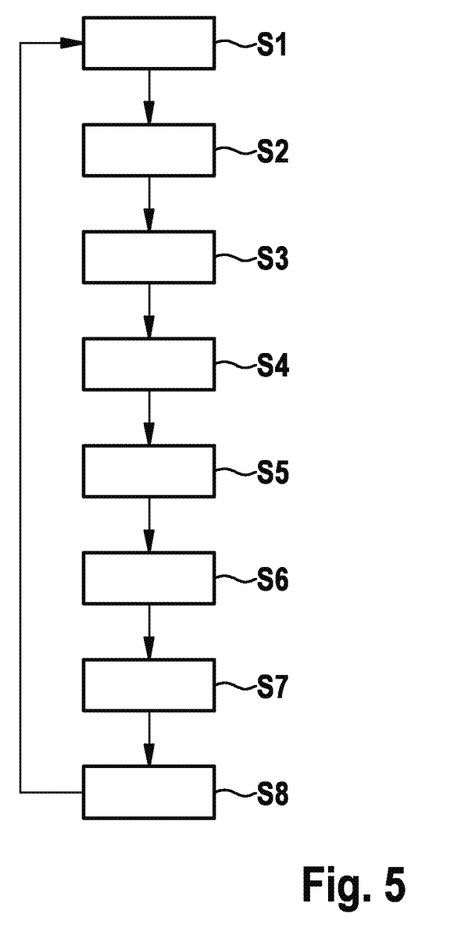
FIG. 5 shows a flowchart for illustrating a method for measuring a surface shape of an optical element.

FIG. 5 shows a flowchart for carrying out a method for measuring the surface shape of the optical element 2, 52, 61 by the measurement apparatus 1 in a measurement environment 39 according to an exemplary embodiment. The method is preferably carried out by the control device 44. For this purpose, the control device 44 preferably has a microprocessor, in particular for executing a computer program whose program code causes the described method to be carried out, and also a RAM and a ROM module, wherein preferably data, for example predetermined target pressures, and programs, such as algorithms, are stored on the ROM module. For the sake of simplicity, the method is described with reference to only the cooling channel 21, without being limited thereto.

In a first step S1, the optical element 2, 52, 61 is provided.

In a second step S2, a liquid or gaseous coolant 22 is fed into the cooling channel 21. This is done, in particular, by controlling the delivery device 23 connected to the coolant reservoir 6. The coolant 22 is or has been selected here in such a way that the refractive index of the coolant 22 is at least substantially equal to the refractive index of the substrate 19 of the optical element 2, 52, 61.

In a third step S3, the cooling channel pressure is recorded, in particular by the pressure recording device 35.

In a fourth step S4, the measurement environment pressure is recorded, in particular by the pressure sensor 43.

In a fifth step S5, an actual pressure difference $$\Delta p_{IST} = p_{K,IST} - P_{M,IST}$$

is determined based on the recorded cooling channel pressure or the actual cooling channel pressure $p_{K,IST}$ and the recorded measurement environment pressure or the actual measurement environment pressure $P_{M,IST}$.

In a sixth step S6, the actual pressure difference $\Delta p_{IST}$ is compared with a target pressure difference $\Delta p_{SOLL}$. The target pressure difference is preferably determined in dependence on a predetermined target measurement environment pressure $p_{M,SOLL}$ and a predetermined target cooling channel pressure $p_{K,SOLL}$:

$$\Delta p_{SOLL} = P_{K,SOLL} - P_{M,SOLL}.$$

The target measurement environment pressure and the target cooling channel pressure are here selected in such a way that the target measurement environment pressure is at least 0.01 mbar and at most 0.20 mbar and the target cooling channel pressure is at least 200 mbar and at most 10 000 mbar, in particular wherein the predetermined target measurement environment pressure is at least 0.03 mbar and at most 0.1 mbar and the target cooling channel pressure is at least 500 mbar and at most 1000 mbar. This ensures that the target conditions, i.e., the target cooling channel pressure and the target measurement environment pressure, correspond at least substantially to EUV conditions, i.e., pressure conditions that are typically present during operation of an EUV lithography apparatus in vacuo. The target cooling channel pressure is selected to be greater than the target measurement environment pressure, in particular, to form an overpressure in the cooling channel 21 so as to ensure coolant transport. Preferably, the target measurement environment pressure and the target cooling channel pressure are selected such that the predetermined target measurement environment pressure is 0.05 mbar and the predetermined target cooling channel pressure is 500 mbar. The target measurement environment pressure preferably corresponds to an ambient pressure, in particular an operating ambient pressure, in an EUV lithography apparatus or a projection exposure apparatus designed for operation in the EUV, in particular a projection exposure apparatus for semiconductor lithography designed as a scanner. The target measurement environment pressure is thus, for example, a target scanner ambient pressure.

In a seventh step S7, a deviation between the actual pressure difference and the target pressure difference is monitored, wherein, if a deviation between the actual pressure difference and the target pressure difference greater than a predetermined limit value is detected, the cooling channel pressure is adapted in such a way that the deviation becomes less than or equal to the predetermined limit value. If the limit value is 10 mbar, for example, and a deviation of more than 10 mbar is detected, the cooling channel pressure is adapted by controlling the delivery device 23 and/or at least one of the pressure regulating valves 28, 29 in such a way that the deviation becomes less than or equal to 10 mbar. The deviation is preferably determined based on the equation:

$$\Delta p_{SOLL} = \Delta p_{IST},  \quad (1)$$

in particular based on the transformation of (1) to $$P_{K,IST} = P_{K,SOLL} - P_{M,SOLL} + P_{M,IST} \quad (2)$$

Since the measurement environment pressure or the actual measurement environment pressure $p_{M,IST}$ is preferably continuously recorded, dynamic pressure fluctuations in the measurement environment 39 are taken into account when determining the deviation and thus when adapting the actual cooling channel pressure. Alternatively, the limit value is preferably less than or equal to 1 mbar, in particular less than or equal to 0.5 mbar, and in particular zero bar. A predetermined flow speed or a volumetric flow rate with which the coolant 22 flows through the cooling channel 21 is preferably likewise set by adapting the delivery rate of the delivery device 23. Optionally, a predetermined flow speed is set, wherein the measurement of the surface shape takes place at two different actual pressure differences, in particular two different measurement environment pressures, and a mean value of the measurement results is then formed. A temperature control device 83 connected to the coolant reservoir 6 is optionally controlled for temperature control, in particular for cooling or heating the coolant 22, in particular for setting a predetermined dynamic viscosity of the coolant 22.

If the deviation is less than or equal to the predetermined limit value, the surface shape is measured in an eighth step S8. In particular, the measurement light source 4 and/or at least one component of the interferometer 5 is controlled or activated for this purpose. To ensure that the deviation remains smaller than the predetermined deviation during the measurement, steps S1 to S7 preferably continue to be carried out or are repeated during the measurement. If it is detected that the deviation is greater than the limit value, the measurement is preferably interrupted and continued only when the deviation is less than or equal to the limit value.

The advantage of the method described is that the surface shape is measured under an actual pressure difference which at least substantially corresponds to a target pressure difference under EUV conditions. This ensures that an ascertained measurement result or an ascertained surface shape of the optical element 2, 52, 61 corresponds to the surface shape that forms or can form in particular under EUV conditions. This ensures particularly reliable operation of the optical element 2, 52, 61 or of a projection exposure apparatus having such an optical element 2, 52, 61. The measurement can take place under any measurement environment pressures, for example under atmospheric pressure or vacuum pressure.

"EUV conditions" in the present case refers to conditions as are typically present during EUV operation of a projection exposure apparatus or EUV lithography apparatus. These conditions relate, in particular, to the operating measurement environment pressure, presently defined by the target measurement environment pressure, and the operating cooling channel pressure, presently defined by the target cooling channel pressure. Optionally, without being limited thereto, these conditions additionally relate to the flow speed of the coolant in the cooling channel, the operating temperature of the EUV lithography apparatus, and/or the wavelength of the EUV light.

Figure 6:
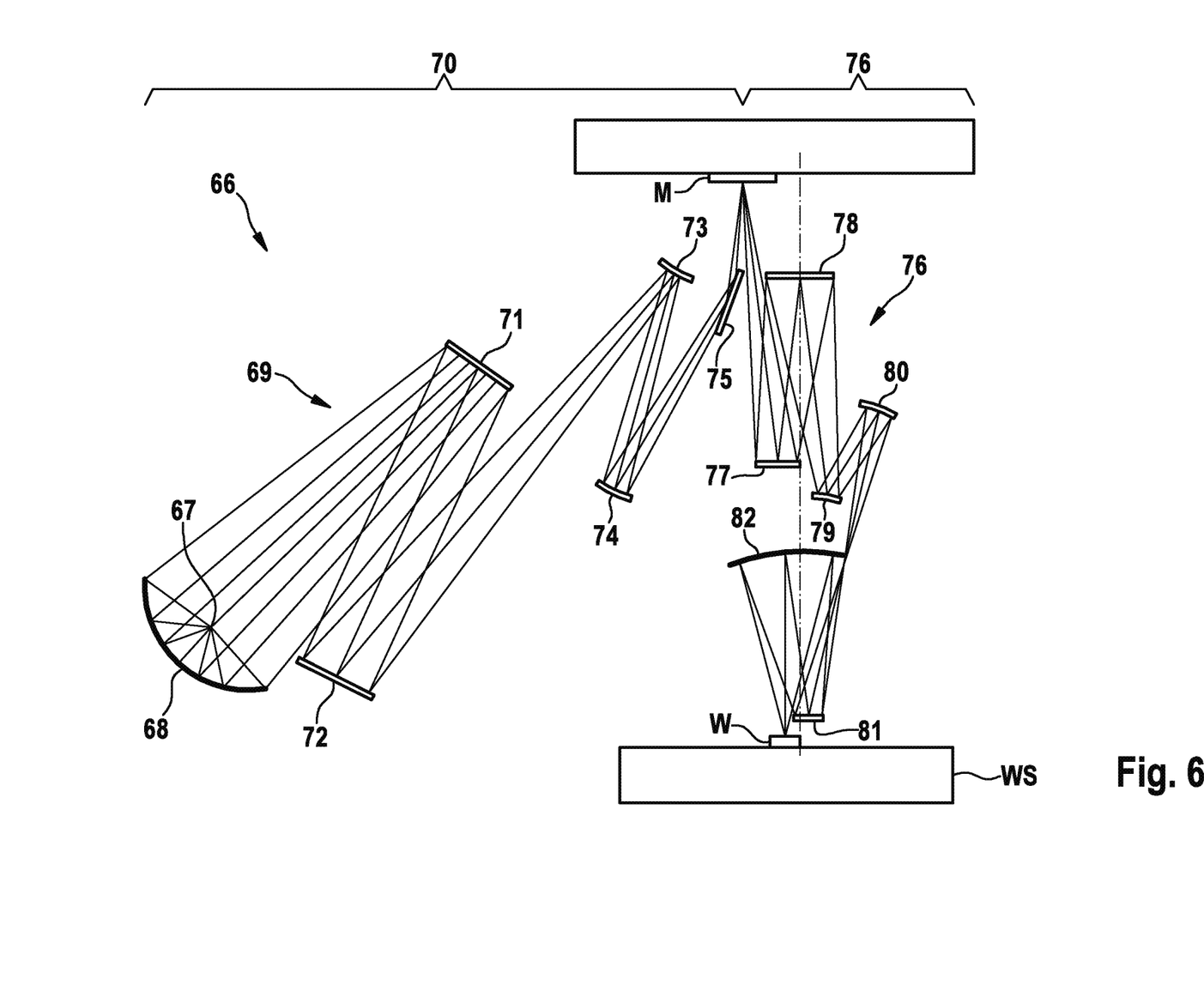
FIG. 6 shows a schematic illustration of a projection exposure apparatus designed for operation in the EUV.

FIG. 6 shows highly schematically a projection exposure apparatus 66 designed for operation in the EUV or an EUV lithography system in the form of an EUV lithography apparatus which has at least one optical element 2, 52, 61 that was produced and/or measured in particular in the manner described above. The projection exposure apparatus 66 has an EUV light source 67 for generating EUV radiation, which has a high energy density in an EUV wavelength range below 50 nm, in particular between about 5 nm and about 15 nm. The EUV light source 67 may, for example, take the form of a plasma light source for generating a laser-induced plasma or of a synchrotron radiation source. In the former case, in particular, a collector mirror 68 may be used, as shown in FIG. 6, in order to focus the EUV radiation of the EUV light source 67 into an illumination beam 69, and in this way increase the energy density further. The illumination beam 69 serves for the illumination of a structured object M by an illumination device 70, which in the present example has five reflective optical elements 71 to 75 (mirrors).

The structured object M may be, for example, a reflective mask or a reticle, which has reflective and non-reflective, or at least less reflective, regions for producing at least one structure on the object M.

The structured object M reflects part of the illumination beam 69 and shapes a projection beam path 75, which carries the information about the structure of the structured object M, and is radiated into a projection lens 76, which generates an imaged representation of the structured object M or of a respective partial region thereof on a substrate W. The substrate W, for example a wafer, comprises a semiconductor material, for example silicon, and is disposed on a mounting, which is also referred to as a wafer stage WS.

In the present example, the projection lens 76 has six reflective optical elements 77 to 82 (mirrors) in order to generate an image of the structure that is present at the structured object M on the wafer W. The number of mirrors in a projection lens 76 typically lies between four and ten; however, only two mirrors can also be used, if appropriate.

The optical element 2, 52, 61 examined within the scope of the disclosed techniques with regard to its surface shape or figure can be any mirror of the projection exposure apparatus 66, for example the collector mirror 68, one of the mirrors 71 to 75 of the illumination device 70, or one of the mirrors 77 to 82 of the projection lens 76. At least one of these mirrors is preferably produced and/or measured according to the method described above.

LIST OF REFERENCE SIGNS

1 Measurement apparatus
2 Optical element
3 Mirror
4 Measurement light source
5 Interferometer
6 Coolant reservoir
7 Optical waveguide
8 Input wave
9 Beam splitter
10 Diffractive optical element
11 Computer-generated hologram (CGH)
12 Reflective element
13 Reflective element
14 Reflective element
15 Interferometer camera
16 Shutter
17 Eyepiece
18 Main body
19 Substrate
Reflective surface
21 Cooling channel
22 Coolant
23 Delivery device
24 Pump
Supply line
26 Discharge line
27 Delivery line
28 Pressure regulation device
29 Two-way pressure regulating valve
30 Three-way pressure regulating valve
31 Inlet side
32 Outlet side
33 Overflow outlet
34 Pressure regulation device
35 Pressure recording device
36 Pressure recording device
37 Sensor
38 Interior space
39 Measurement environment
40 Housing
41 Vacuum chamber
42 Vacuum generating unit
43 Pressure sensor
44 Control device
45 Cooling channel
46 Cooling channel
47 Cooling channel
48 First connection opening
49 Second connection opening
50 Cooling channel plane
51 Cooling channel wall
52 Optical element
53 Substrate
54 Reflective surface
55 Mirror body
56 Cooling channel
57 Cooling channel
58 Cooling channel
59 Cooling channel
60 Boundary layer
61 Optical element
62 Reflective surface
63 Mirror body
64 Substrate
65 Boundary layer
66 Projection exposure apparatus
67 EUV light source
68 Collector mirror
69 Illumination beam
70 Illumination device
71 Optical element
72 Optical element
73 Optical element
74 Optical element
75 Optical element
76 Projection lens
77 Optical element
78 Optical element
79 Optical element
80 Optical element
8 Optical element
82 Optical element
83 Temperature control device
84 First tangential plane
85 Second tangential plane
86 Third tangential plane
87 Straight line
88 Supply line section
89 Optical axis

What is claimed is:

1. A method for measuring a surface shape of an optical element in a predetermined measurement environment, wherein the optical element comprises a main body with a substrate and a reflective surface, and wherein at least one cooling channel for receiving a coolant is formed in the substrate,
the method comprising:
 a) recording a cooling channel pressure,
 b) recording a measurement environment pressure,
 c) determining an actual pressure difference based on the cooling channel pressure and the measurement environment pressure,
 d) comparing the actual pressure difference with a predetermined target pressure difference,
 e) monitoring for a deviation between the actual pressure difference and the target pressure difference, wherein, if a deviation greater than a predetermined limit value is detected, the cooling channel pressure is adapted in such a way that the deviation becomes less than or equal to the predetermined limit value, and
 f) measuring the surface shape if the deviation is less than or equal to the predetermined limit value.

2. The method of claim 1, wherein the cooling channel pressure is adapted so that the deviation is less than 10 mbar.

3. The method of claim 2, wherein the cooling channel pressure is adapted so that the deviation is less than 1 mbar.

4. The method of claim 1, further comprising feeding a liquid or gaseous coolant into the cooling channel, wherein a pressure on the coolant is increased or decreased in order to adapt the cooling channel pressure.

5. The method of claim 4, wherein the pressure on the coolant is increased or decreased hydraulically or pneumatically.

6. The method of claim 4, wherein feeding the coolant comprises feeding the coolant such that the coolant flows through the cooling channel at a predetermined flow speed.

7. The method as of claim 4, wherein the coolant comprises a refractive index is substantially equal to the refractive index of the substrate of the optical element.

8. The method of claim 1, wherein the target pressure difference is determined based upon a predetermined target measurement environment pressure and a predetermined target cooling channel pressure, wherein the target measurement environment pressure is at least 0.01 mbar and at most 0.20 mbar and the target cooling channel pressure is at least 200 mbar and at most 10 000 mbar.

9. The method of claim 8, wherein the predetermined target measurement environment pressure is 0.05 mbar and the predetermined target cooling channel pressure is 500 mbar.

10. A measurement apparatus for examining a surface shape of an optical element, wherein the optical element has a main body with a substrate and a reflective surface, and wherein at least one cooling channel for receiving a coolant is formed in the substrate, the measurement apparatus comprising:
  i) a measurement light source,
  ii) an interferometer with which an examination of at least a partial surface of a surface of the optical element is carried out by interferometric superimposition of a test wave, which is obtained from measurement light produced by the measurement light source and is directed onto the optical element, and a reference wave;
  iii) at least one controllable coolant reservoir for storing coolant, and
  iv) a control device, which is configured to carry out the method as claimed in claim 1.

11. The measurement apparatus of claim 10, wherein the coolant has a refractive index that is substantially equal to a refractive index of the substrate of the optical element.

12. The measurement apparatus of claim 10, wherein the coolant is a solution of an inorganic or organic substance in water.

13. The measurement apparatus of claim 12, wherein the inorganic or organic substance forms a homogeneous phase when mixed with water.

* * * * *